United States Patent
Orla-Jensen et al.

(10) Patent No.: US 10,881,005 B2
(45) Date of Patent: Dec. 29, 2020

(54) METHODS FOR DISPENSING A LIQUID OR VISCOUS MATERIAL ONTO A SUBSTRATE

(71) Applicant: NORDSON CORPORATION, Westlake, OH (US)

(72) Inventors: Per Orla-Jensen, Vista, CA (US); Kenneth S. Espenschied, Olmsted Township, OH (US); Patrick T. Hogan, San Marcos, CA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 15/176,570

(22) Filed: Jun. 8, 2016

(65) Prior Publication Data

US 2017/0359901 A1    Dec. 14, 2017

(51) Int. Cl.
*H05K 3/00*        (2006.01)
*B25J 9/16*        (2006.01)
(Continued)

(52) U.S. Cl.
CPC ......... *H05K 3/0008* (2013.01); *B25J 9/1697* (2013.01); *H05K 13/0469* (2013.01);
(Continued)

(58) Field of Classification Search
CPC ............ H05K 3/0005; H05K 3/0008; H05K 2203/0736; H05K 2203/163; B05D 1/02; B05C 5/00; B05C 11/00; G05B 2219/49154; G05B 2219/40425; G05B 2219/45235; G05B 2219/40476
(Continued)

(56) References Cited

U.S. PATENT DOCUMENTS 5,328,085 A * 7/1994 Stoops ................... B23K 1/203
                                                        118/687
6,093,251 A * 7/2000 Carr ................... H05K 13/0469
                                                        118/323
(Continued)

OTHER PUBLICATIONS

ISA/220—Notification of Transmittal or Search Report and Written Opinion of the ISA, or the Declaration dated Aug. 24, 2017 for WO Application No. PCT/US17/035357.
(Continued)

*Primary Examiner* — Brian K Talbot
(74) *Attorney, Agent, or Firm* — Baker & Hostetler LLP

(57) ABSTRACT

Systems and methods for dispensing a liquid or viscous material onto a substrate are disclosed herein. One exemplary method of positioning an applicator of a dispensing system to apply a liquid or viscous material to an electronic substrate includes generating a two-dimensional image of the electronic substrate using a camera communicatively connected to the dispensing system. Based on the two-dimensional image of the electronic substrate, a first set of one or more sub-regions of the electronic substrate having one or more components that protrude above the surface of the electronic substrate is identified. The method further includes using height information relating to the one or more sub-regions having the one or more components to determine a control program for the dispensing system to position the applicator relative to the electronic substrate and dispense the liquid or viscous material onto the electronic substrate.

38 Claims, 10 Drawing Sheets

(51) Int. Cl.
*H05K 13/04* (2006.01)
*H05K 13/08* (2006.01)

(52) U.S. Cl.
CPC ............... *H05K 13/0853* (2018.08); *G05B 2219/40425* (2013.01); *G05B 2219/40476* (2013.01); *G05B 2219/45235* (2013.01); *G05B 2219/49154* (2013.01); *H05K 3/0005* (2013.01); *H05K 2203/0736* (2013.01); *H05K 2203/163* (2013.01); *Y10S 901/43* (2013.01)

(58) Field of Classification Search
USPC .................... 427/96.2–96.6, 98.4, 421.1
See application file for complete search history.

(56) References Cited

U.S. PATENT DOCUMENTS

| | | | | |
|---|---|---|---|---|
| 6,132,809 | A * | 10/2000 | Hynes | B05B 13/0431 118/313 |
| 7,028,867 | B2 | 4/2006 | Acum et al. | |
| 7,256,833 | B2 * | 8/2007 | Shaw | H04N 5/2256 118/713 |
| 7,404,861 | B2 * | 7/2008 | Prentice | H05K 13/0469 118/305 |
| 8,545,929 | B2 * | 10/2013 | Espenschied | B05B 12/085 427/427.3 |
| 8,857,050 | B2 * | 10/2014 | Bedinger | H01L 23/3192 29/527.2 |
| 9,205,562 | B1 | 12/2015 | Konolige et al. | |
| 10,082,417 | B2 * | 9/2018 | Crowell, III | G01F 25/0092 |
| 2002/0078580 | A1 * | 6/2002 | Haugen | H05K 13/0815 33/533 |
| 2002/0142102 | A1 * | 10/2002 | Romine | B05C 5/0212 427/10 |
| 2005/0095366 | A1 * | 5/2005 | Fang | H01L 21/56 427/421.1 |
| 2008/0055878 | A1 * | 3/2008 | Salzman | H05K 3/284 361/818 |
| 2008/0166490 | A1 * | 7/2008 | Hogan | B05B 7/24 427/422 |
| 2009/0107398 | A1 * | 4/2009 | Hassler, Jr. | B05C 5/0279 118/315 |
| 2009/0202709 | A1 * | 8/2009 | Szuch | B05B 12/00 427/96.4 |
| 2010/0319981 | A1 * | 12/2010 | Kapusta | H05K 9/0024 174/350 |
| 2014/0079871 | A1 | 3/2014 | Lu et al. | |
| 2014/0230727 | A1 * | 8/2014 | Suriawidjaja | B05C 11/00 118/712 |
| 2016/0008835 | A1 * | 1/2016 | Giusti | B05B 3/00 427/256 |

OTHER PUBLICATIONS (IPEA/409) International Preliminary Report on Patentability Chapter II or (IB/373) International Preliminary Report on Patentability Chapter I dated Dec 20, 2018 for WO Application No. PCT/US17/035357.

\* cited by examiner

METHODS FOR DISPENSING A LIQUID OR VISCOUS MATERIAL ONTO A SUBSTRATE

TECHNICAL FIELD

The present disclosure generally relates to dispensing liquid or viscous materials and, more particularly, to systems and methods for dispensing a liquid or viscous material onto a substrate.

BACKGROUND

Many industrial applications require the discrete, well-defined, and uniform applications of a liquid or viscous material to predetermined areas of a substrate. Such material applications are very useful in varied processes, such as conformal coatings on non-uniform or irregular substrates like electronic circuit boards. In particular, conformal coating material is used to protect selected components of a circuit board from moisture, dirt, etc. Other processes in which such material applications are useful include liquid dispensing processes, such as an adhesive dispensing process.

To apply a liquid or viscous material to a substrate, a dispensing system may have a controller that directs the movement and operation of a robotic arm and attached applicator according to a pre-determined control program. The control program is typically prepared according to the particular requirements of the substrates onto which the material is to be dispensed, such as the various areas of the substrate that require material, the dimensions thereof, the necessary amount of material to be applied, etc. Generating a control program presents various challenges, however. For instance, the control program should be accurate to the actual substrate and components thereof. Further, the control program should account for the three-dimensional contours of the substrate, such as electronic components vertically protruding on a circuit board. Failure to account for the three-dimensional contours may result in the applicator colliding with a component of the substrate, thus, at best, disrupting the dispensing process or, at worst, damaging the component and/or the applicator.

One prior method of generating a control program is for a technician to manually create the control program. This method is undesirably slow and inefficient. Another prior method of generating a control program includes importing a CAD (computer-aided design) model or other detailed digital model of the substrate and using that model to generate the control program. This method, however, has proven unsatisfactory due to the significant time and financial overhead required to maintain a library of multiple CAD models for the various types of substrates onto which material may be dispensed. Therefore, there is a need for an improved system and method for generating a control program for dispensing a liquid or viscous material to a substrate.

SUMMARY

Disclosed herein are system and methods for dispensing a liquid or viscous material onto a substrate. In one embodiment, a method of positioning an applicator of a dispensing system, the applicator configured to dispense a liquid or viscous material onto an electronic substrate, includes generating a two-dimensional image of the electronic substrate using a camera communicatively connected to the dispensing system. Based on the two-dimensional image of the electronic substrate, a first set of one or more sub-regions of the electronic substrate having one or more components that protrude above the surface of the electronic substrate is identified. The method further includes using height information relating to the one or more sub-regions having the one or more components to determine a control program for the dispensing system to position the applicator relative to the electronic substrate and dispense the liquid or viscous material onto the electronic substrate.

In another implementation, a method of positioning an applicator of a dispensing system, the applicator configured to dispense a liquid or viscous material onto an electronic substrate includes determining a height value for each of a plurality of regions of the electronic substrate using a height sensor. Based on the height value for each of the plurality of regions of the electronic substrate, a height map of the electronic substrate is generated. The method further includes determining, based on the height map, a control program for the dispensing system to position the applicator relative to the electronic substrate to dispense the liquid or viscous material onto the electronic substrate.

In another implementation, a method of positioning an applicator of a dispensing system, the applicator configured to dispense a liquid or viscous material onto an electronic substrate, includes generating a two-dimensional image of the electronic substrate using a camera communicatively connected to the dispensing system. A height map of the electronic substrate is generated using a height sensor. Based on the two-dimensional image and the height map, a three-dimensional representation of the electronic substrate is generated. The method further includes determining, based on the three-dimensional representation, a control program for the dispensing system to position the applicator relative to the electronic substrate to dispense the liquid or viscous material onto the electronic substrate.

BRIEF DESCRIPTION OF THE DRAWINGS

The following detailed description is better understood when read in conjunction with the appended drawings. For the purposes of illustration, examples are shown in the drawings; however, the subject matter is not limited to the specific elements and instrumentalities disclosed.

DETAILED DESCRIPTION

Figure 1:
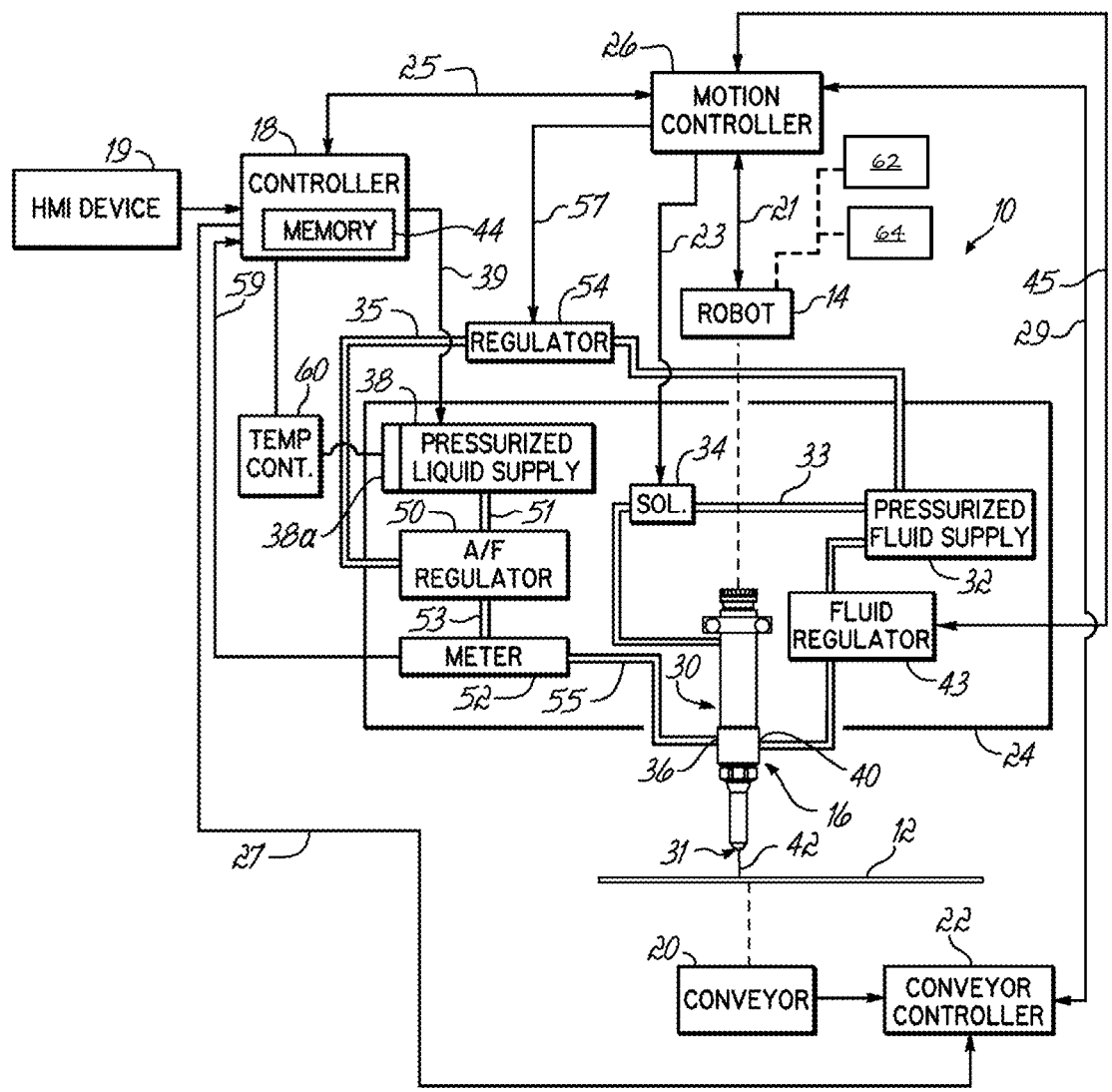
FIG. 1 illustrates a schematic view of a computer-controlled dispensing system in accordance with an embodiment.

With reference to FIG. 1, a dispensing system 10 may be used to apply a liquid or viscous material (hereinafter referred to as "material"), such as a liquid conformal coating material or liquid adhesive, to a series of substrates, such as the representative substrate 12. Although the operation of a representative dispensing system 10 will be described herein, those skilled in the art will appreciate that a wide variety of other dispensing systems may be used to complete the methods described below. The dispensing system 10 may be, for example, a Model SC-105, SC-205, or SC-400 conformal coating applicator commercially available from Asymtek (Carlsbad, Calif.).

In the representative embodiment, the dispensing system 10 includes a multi-axis electro-mechanical positioner or robot 14 and a liquid or viscous material applicator 16 coupled with the robot 14. For example, the applicator 16 may be suspended from or attached to the robot 14 above the substrates 12. In one embodiment, the robot 14 is adapted to move or position the applicator 16 in directions defined within an X-Y-Z Cartesian coordinate frame to supply three degrees of freedom. The robot 14 includes a drive coupled to independently controllable motors (not shown) in a known manner. The applicator 16 is manipulated by the robot 14 relative to the substrate 12 for applying amounts of material to selected areas of the substrate 12. In an alternative embodiment, the substrate 12 is moved while the applicator 16 is held stationary. For example, instead of the applicator 16 being coupled with the robot 14, the robot 14 or positioner may be configured to move the substrate 12. For instance, the substrate 12 may be placed upon the robot 14 or otherwise removably coupled with the robot 14. One such robot 14 or positioner is described in commonly-assigned U.S. Pat. No. 8,944,001, which is herein incorporated by reference in its entirety. In another alternative embodiment, both the substrate 12 and the applicator 16 are moved relative to one another. Such an embodiment may include two robots 14—one robot 14 to move the applicator 16 and another robot 14 to move the substrate. Accordingly, it will be appreciated that the principles described herein regarding the positioning of the applicator 16 relative to the substrate 12 are equally applicable whether the applicator 16 is moved relative to a stationary substrate 12, the substrate 12 is moved relative to a stationary applicator 16, or the substrate 12 and the applicator 16 are both moved relative to one another.

The dispensing system 10 further includes a camera 62 and a height sensor 64, positioned such that the camera 62 may generate a two-dimensional image of the substrate 12 and the height sensor 64 may gather height data for the substrate 12 and the protruding components thereof. In an aspect, the camera 62 and/or the height sensor 64 may be positioned on the robot 14. In a manner similar to the robot 14 moving the applicator 16, the robot 14 may position or move the camera 62 and/or height sensor 64 in directions defined within an X-Y-Z Cartesian coordinate frame to give the camera 62 and height sensor 64 three degrees of movement. As will be discussed further herein, the robot 14 may sequentially move the camera 62 and/or height sensor 64 over a series of regions defined with respect to the substrate 12 to gather image data and/or height data. In some aspects, the camera 62 and/or the height sensor 64 are positioned on the applicator 16. In other aspects, the dispensing system 10 may further include a second or third robot 14 that each may include and position one or more of the camera 62 and/or the height sensor 64. For example, a first robot 14 may position the applicator 16 and a second robot 14 may position the camera 62 and the height sensor 64.

The height sensor 64 may comprise, for example, a laser height sensor, a mechanical height sensor, a coordinate measurement machine (CMM), a camera, or other system for measuring the distance between the height sensor 64 and the substrate 12 and/or the distance a portion of the substrate 12 vertically protrudes from other portions (e.g., the horizontal surface) of the substrate 12. In an aspect, the height sensor 64 and the camera 62 may be integrated in a single sensor or device that is configured to obtain a two-dimensional image of the substrate 12 as well as gather height data on the substrate 12.

A programmable controller 18 coordinates the movements and actuations of the dispensing system 10. The controller 18 may be a programmable logic controller (PLC), a microprocessor based controller, personal computer, or another conventional control device capable of carrying out the functions described herein as understood by a person having ordinary skill in the art. For example, the controller 18 may perform the various methods relating to generating a control program based on a two-dimensional image, a height map, and/or a three-dimensional representation, as described in detail below. A human machine interface (HMI) device 19 is operatively connected to the controller 18 in a known manner. The HMI device 19 may include input devices and controls, such as a keypad, push-buttons, control knobs, a touch screen, etc., and output devices, such as displays and other visual indicators, that are used by an operator to control the operation of the controller 18 and, thereby, control the operation of the dispensing system 10. The HMI device 19 may further include an audio output device, such as a speaker, by which an audio alert may be communicated to an operator.

The substrates 12 are supported in an operative relationship with the applicator 16 and material is applied from the applicator 16 onto selected areas on each substrate 12. Depending on the dispensing application, a series of substrates 12 may have material dispensed thereon in a batch mode. Alternatively, the substrates 12 may be continuously transported past the applicator 16 on an automatic conveyor 20. The conveyor 20 has a conventional design and, furthermore, may have a width that can be adjusted to accommodate substrates 12 of different dimensions. The conveyor 20, which may also include pneumatically operated lift and lock mechanisms (not shown), receives command signals from a conveyor controller 22. Further, the conveyor 20 may be integrated with the robot 14 configured to provide three-dimensional positioning of the substrate 12 relative to the applicator 16.

Each of the substrates 12 may have a number of components disposed on a generally horizontal surface of the substrate 12, some of which may vertically protrude from the horizontal surface of the substrate 12. For example, a printed circuit board (PCB) substrate 12 may include a number of electronic components that vertically protrude from the surface of the PCB. Such components may include, as examples, resistors, transistors, capacitors, inductors, diodes, wires, and conductive traces. Components of a PCB may also include a variety of connectors, plugs, or sockets. It may be desirable to apply a material, such as conformal coating, to one or more of the components of the substrate 12 while leaving other portions of the substrate 12 uncoated or coated with a different (e.g., lesser) thickness of coating. It will be appreciated that any use of the term "substrate" herein is not limited in meaning to the whole or entirety of a substrate but will also be understood to mean any portion, section, or subset of a substrate.

Figure 4:
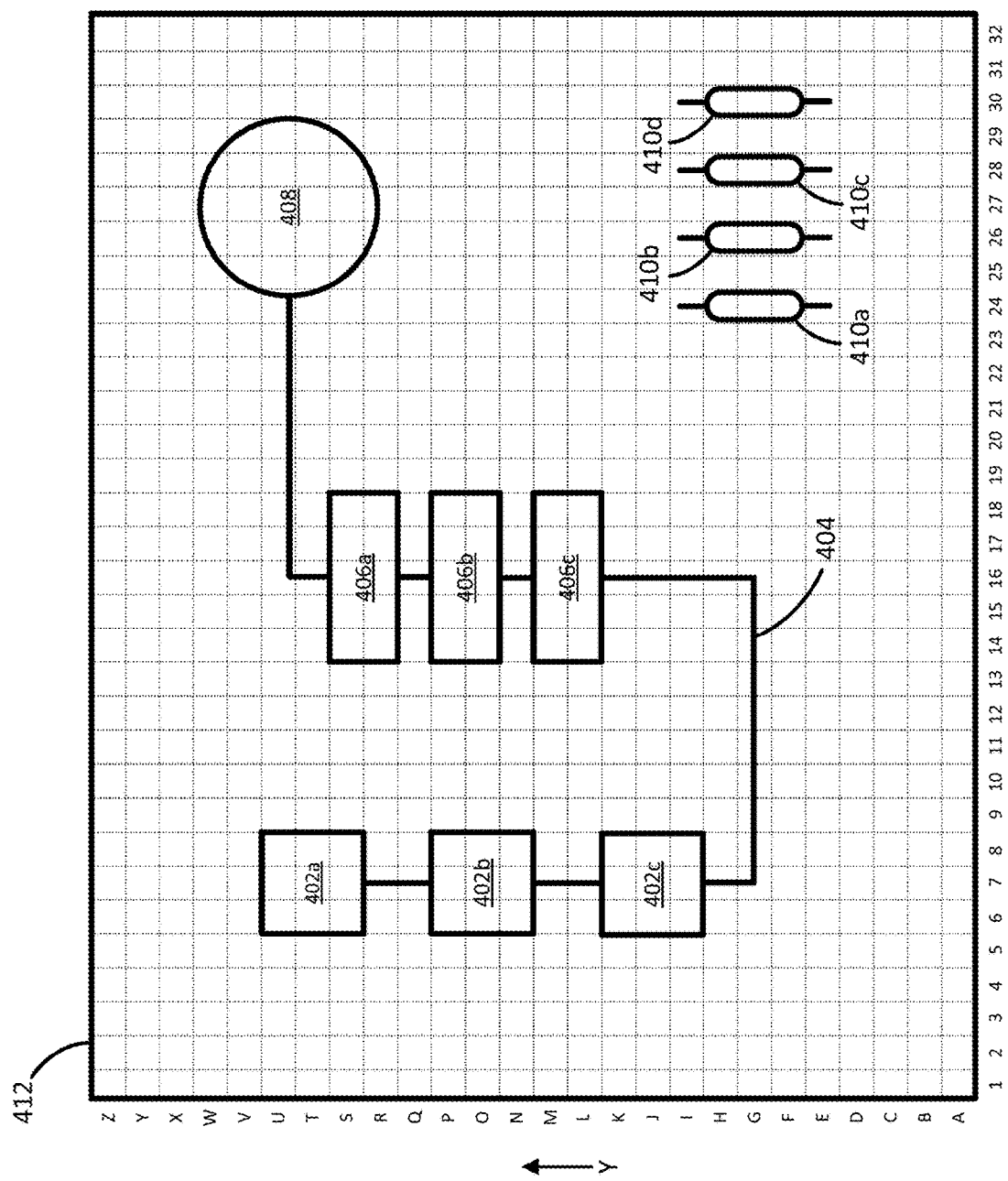
FIG. 4 illustrates an overhead view of an exemplary substrate in accordance with an embodiment.

FIG. 4 illustrates an overhead view of a substrate 412 with various components thereon as one simplified example of the substrate 12. The substrate 412 includes connectors 402a-c, transistors 406a-c, a capacitor 408, and resistors 410a-d. A conductive trace 404 connects the connectors 402a-c and the transistors 406a-c. For purposes of discussion further herein, the substrate 412 is depicted in FIG. 4 with an overlaid two-dimensional grid of regions or cells. The regions or cells are identified along the X-axis as 1-32 and along the Y-axis as A-Z.

Referring again to FIG. 1, the applicator 16 is electrically coupled with an applicator controller 24, which supplies command signals that control the operation of the applicator 16. A motion controller 26 is electrically coupled by a communication link 21 with the robot 14. The solenoid 34 is electrically coupled by a communication link 23 with the motion controller 26. The conveyor controller 22 and motion controller 26 are also electrically coupled with controller 18 over respective communication links 25, 27. The motion controller 26 is electrically coupled over a communication link 29 with the conveyor controller 22. Thus, a programmable control system for the dispensing system 10 includes the controller 18, the applicator controller 24, the motion controller 26, and the optional conveyor controller 22 as interconnected components that communicate with each other.

The motion controller 26 supplies command signals to the robot 14 over the communication link 21. The command signals are used by the robot 14 to control the position and/or velocity of the applicator 16 and/or the position and/or velocity of the substrate 12. Generally, the robot 14 includes electric motors, such as servo motors or stepper motors, that drive the motion of the different axes of the robot 14.

The applicator 16 includes a body 30 suspended from the robot 14, a nozzle 31 mounted to one end of the body 30, and a flow control mechanism (not shown) disposed inside the body 30. The flow control mechanism inside the body 30 may comprise an air-actuated needle, an air piston, and a valve seat that cooperate to form a dispensing valve (not shown) operative to control a flow of material (e.g., conformal coating material, liquid adhesive, etc.) dispensed from the applicator 16. A pressurized fluid supply 32 and a solenoid 34 cooperate to supply pressurized fluid in a known manner to regulate the actuation of the dispensing valve inside the body 30. Specifically, the solenoid 34 controls air pressure in a conduit 33 connecting the pressurized fluid supply 32 with the applicator 16 so as to move the air piston and, thereby, move the needle relative to the valve seat to provide an opened position for the dispensing valve in which material is dispensed from the applicator 16 onto the substrate 12. The solenoid 34 may vent the air pressure acting on the air piston to permit the needle to return to a closed position in which the needle contacts the valve seat to discontinue the dispensing. It will be appreciated that applicator types other than that just described may be alternatively employed in the dispensing system 10. For example, a jetting applicator may be employed in which the needle is moved toward and engages with the valve seat to cause liquid or viscous material to be jet from an opening in the valve seat.

The dispensing system 10 includes a pressurized liquid supply 38 that operates in a known manner under the command of controller 18 to generate a continuous stream or supply of the pressurized material. For example, the pressurized liquid supply 38 may include a diaphragm or piston pump that siphons amounts of material from a reservoir and then pumps the stream of material under pressure from the reservoir through a fluid path to the applicator 16. The pressurized liquid supply 38 is electrically connected by a communication link 39 with the controller 18, which can regulate operating parameters such as the temperature and pressure of a material by communicating appropriate control signals to the pressurized liquid supply 38 over communication link 39.

The pressurized liquid supply 38 is optionally configured with one or more conventional heating elements 38a that are electrically coupled with a conventional temperature controller 60 that is electrically coupled with the controller 18. The construction and operation of conventional heating elements, such as heating elements 38a, and temperature controllers, such as temperature controller 60, are understood by a person having ordinary skill in the art. In an alternative embodiment, the applicator 16 may include heating element (not shown) or a heating element (not shown) may be disposed in the one of the conduits 51, 53, 55. Regardless of the specific location of the heating element in the flow path between the pressurized liquid supply 38 and the nozzle 31, the material may be heated in this flow path before being applied to the substrate 12.

The applicator 16 includes a liquid inlet 36 that is coupled in fluid communication with a pressurized liquid supply 38. The material is supplied from the pressurized liquid supply 38 to the applicator 16 through the liquid inlet 36 for regulated dispensing out of a dispensing orifice (not shown) in the nozzle 31. The body 30 has a fluid inlet 40 coupled with pressurized fluid supply 32 and internal passageways (not shown) that direct the pressurized fluid to outlets in the vicinity of the dispensing orifice in nozzle 31, where the pressurized fluid is discharged to interact with and manipulate the stream 42 of material that is sprayed from the applicator 16. A fluid regulator 43, which communicates over communication link 45 with motion controller 26, controls the flow of pressurized fluid from the pressurized fluid supply 32 to the fluid inlet 40. A representative applicator similar to applicator 16 is described in U.S. Pat. No. 7,028,867, the disclosure of which is hereby incorporated by reference herein in its entirety.

The dispensing system 10 is operated as instructed by a library of operational cycles or sequences that are stored in a memory 44 associated with the controller 18 and/or stored in other computers. The operational sequences are recalled and placed in a particular control program, as desired, executing on the controller 18. The operational sequences can be adjusted to accommodate different environmental conditions, different types of substrates 12, or different types of material. During operation, the controller 18 can transfer an entire control program as electrical signals over communication link 25 to the motion controller 26 for execution at the motion controller 26. Alternatively, the controller 18 can transfer one or more instructions as electrical signals over communication link 25 in a batch of instructions and data to the motion controller 26 for subsequent execution. The operator may enter parameters, such as the type of substrate 12, an identifier of the substrate 12, a description of the substrate 12, the type of material, the material pressure, the assist air pressure, the velocity of the applicator 16, the distance between the substrate 12 and applicator 16, etc., at the HMI device 19. The entered parameters are stored in the memory 44 of controller 18 for future use in an operational sequence. Each substrate 12 is matched by the controller 18 with a dispensing control program that determines which specific components and areas of the substrate 12 to which material is to be applied. Typically, the material is applied to only selected areas and/or components on the substrate 12.

With continued reference to FIG. 1, an "air over fluid" (A/F) regulator 50 and a flow meter 52 are situated in the flow path for the material from the pressurized liquid supply 38 to the liquid inlet 36 of the applicator 16. As a result, the material is constrained to flow through the A/F regulator 50 and flow meter 52 in transit from the pressurized liquid supply 38 to the applicator 16. A liquid input of the A/F regulator 50 is coupled by a conduit 51 with a liquid outlet of the pressurized liquid supply 38. Similarly, the A/F regulator 50 has a liquid outlet coupled by a conduit 53 with a liquid input of the flow meter 52, which in turn has a liquid outlet coupled by a conduit 55 with the liquid inlet 36 of the applicator 16.

The A/F regulator 50 controls the fluid pressure of the pressurized material in transit in the fluid path to the applicator 16. The controller 18 is electrically coupled by a communication link 57 with a regulator 54. In one embodiment, the regulator 54 may be a "voltage over pressure" (E/P) regulator that receives a control voltage from the motion controller 26 and includes a transducer that converts the control voltage to a fluid pressure. Alternatively, the regulator 54 may receive a control current or a serial communications signal, instead of a control voltage, for conversion to a fluid pressure. The regulator 54 delivers pressurized material to the A/F regulator 50 for use in controlling the fluid pressure of the material flowing through the A/F regulator 50.

The A/F regulator 50 is positioned in a conduit 35 defining a fluid path between the pressurized liquid supply 38 and the flow meter 52. In an alternative embodiment, the flow meter 52 may be positioned in the fluid path between the pressurized liquid supply 38 and the A/F regulator 50 so that the flow meter 52 is upstream from the A/F regulator 50. With this alternative arrangement, the A/F regulator 50 would alter the pressure of the material after the material has flowed through the flow meter 52. As another alternative embodiment, the flow meter 52 may be positioned to measure an air flow into the pressurized liquid supply 38. In yet another alternative embodiment, the A/F regulator 50 may be omitted in favor of other mechanisms to control the fluid pressure of the fluid leading from the pressurized liquid supply 38 to the applicator 16. For example, a pump (not shown) may be used to siphon the material from the pressurized liquid supply 38. As another example, the pressure of the pressurized liquid supply 38 may be directly regulated to affect the pressure of the material supplied therefrom to the meter 52 and/or the applicator 16. In some aspects, the meter 52 may be omitted.

The controller 18 is electrically coupled by a communication link 59 with the flow meter 52. In response to the flow of material from the conduit 53 to the conduit 55, the flow meter 52 generates a string of counts or electrical pulses each representing a fixed volume of material flowing through or past the flow meter 52. Alternatively, the string of electrical pulses from the flow meter 52 may be communicated from the flow meter to the motion controller 26 and then relayed from the motion controller 26 to the controller 18. In one embodiment, the flow meter 52 may comprise a gear meter that rotates in response to flow through the gear meter and, for a fixed amount of rotation representing a known volume, generates an electrical pulse with an encoder that is transmitted as an electrical signal in a signal stream to the controller 18. For example, the gear meter may generate a pulse for every 0.04 cubic centimeters of material flowing through the flow meter 52. In another embodiment, the flow meter 52 may comprise a thermal mass flow meter.

In use and with reference to FIG. 1, the controller 18 obtains a dispensing program for the substrate 12 when substrate 12 is properly positioned relative to the applicator 16. The dispensing program determines which components and/or areas of the substrate 12 material is to be dispensed thereon, which is usually applied in strips, dots, or spots. The controller 18 retrieves an operational sequence from the memory 44 of controller 18 and, in turn, communicates control signals to the motion controller 26 over the communication link 25 representing the operational sequence. The motion controller 26 sends command signals to the robot 14 over the communication link 21 that instruct the robot 14 to move the applicator 16 (or the substrate 12) at specified velocities to desired locations with respect to the substrate 12 (or the applicator 16, respectively). The motion controller 26 controls the movements of the robot 14 to move the applicator 16 in a plane (e.g., X and Y directions) across the substrate 12, opening and closing the dispensing valve in the applicator 16 as necessary during this movement to apply the material to the desired components and areas of the substrate 12.

Specifically, at any particular location on the substrate 12, the motion controller 26 also provides a command signal to the solenoid 34 to cause it to change state to open the dispensing valve causing discharge of material from nozzle 31. Concurrently, the motion controller 26 provides command signals to the robot 14 to initiate motion of the applicator 16 relative to the substrate 12. The stream 42 of material may be optionally manipulated by an assist fluid, such as air, that affects the shaping of the stream 42 discharged from the applicator 16. After a predetermined time lapses, the motion controller 26 subsequently changes the state of the valve command signal to return the solenoid 34 back to its original state. This action closes the dispensing valve to discontinue the discharge of material from the nozzle 31 of the applicator 16. The motion controller 26 may cause the dispensing valve of the applicator 16 to open and close the dispensing valve multiple times (e.g., twenty-five times) during the extent of the dispensing program so that multiple components and areas of the substrate 12 receive an amount of material.

During the dispensing program or in preparation for the execution of the dispensing program, the controller 18 provides electrical signals to the motion controller 26, which prompt the motion controller 26 to provide command signals to the regulator 54. The regulator 54 controls an air pressure supplied to the A/F regulator 50 to selecting a liquid pressure for the pressurized material flowing from the pressurized liquid supply 38 to the applicator 16. The selected value of liquid pressure, which is dispensing application dependent, may further depend on the desired flow rate of the material. The flow rate for the material is influenced, among other factors, by the liquid pressure, the diameter of the discharge orifice in the dispensing nozzle 31, the material viscosity, etc.

Figure 2:
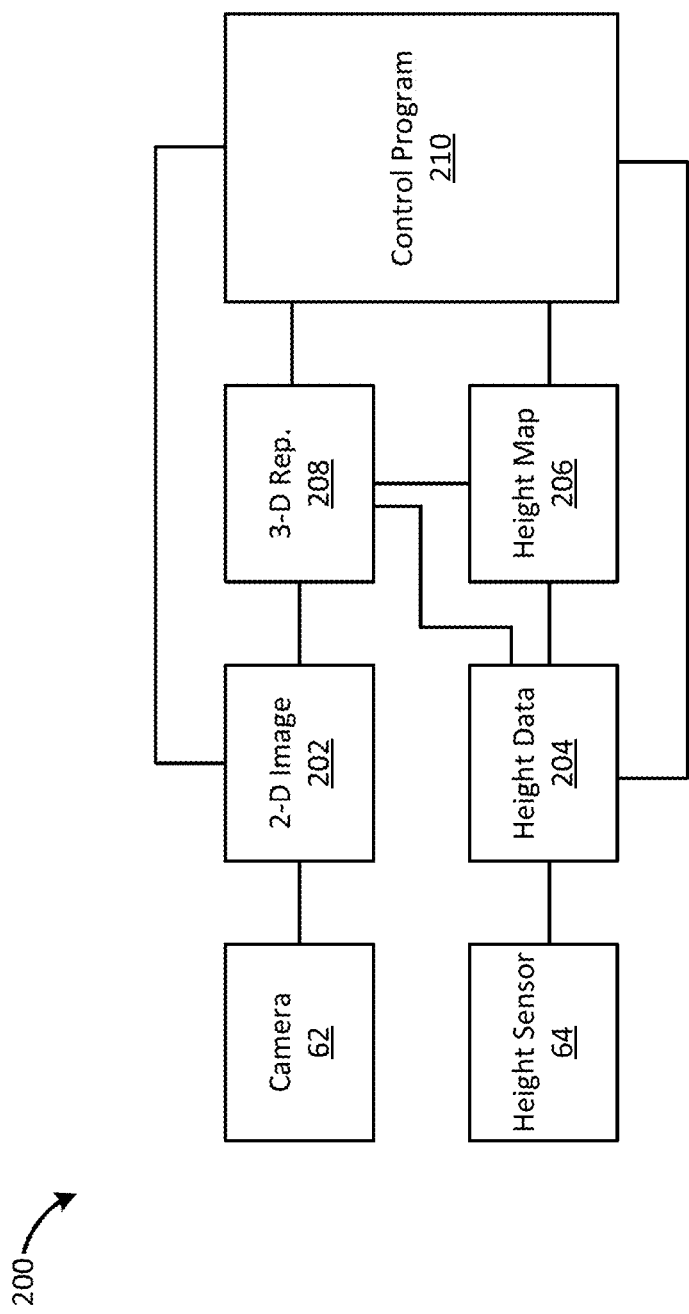
FIG. 2 illustrates a block diagram of an exemplary data flow in accordance with an embodiment.

FIG. 2 provides an illustrative flow diagram 200 of various operations relating to systems and methods for dispensing a material onto a substrate. A two-dimensional image 202 of the substrate 12 may be accessed or received, such as from the camera 62 of the dispensing system 10. The two-dimensional image 202 may be gathered by the camera 62 as a single image or the two-dimensional image 202 may be gathered by the camera 62 as a series of images that are then combined into the single two-dimensional image 202. For example, the robot 14 having the camera 62 disposed thereon may systematically move the camera 62 over the substrate 12 while the camera 62 gathers the series of images of the substrate 12. The two-dimensional image 202 of the substrate 12 may be in the form of a raster image having a two-dimensional grid of regions in which each region has one or more values representative of one or more visual attributes (e.g., color, intensity, shade, transparency, etc.) of the portion of the substrate 12 corresponding to that region.

Further, height data 204 relating to the substrate 12 and vertically protruding components thereof may be accessed or received, such as from the height sensor 64 of the dispensing system 10. The height data 204 represents the distance that one or more vertically protruding components of the substrate 12 vertically extend from the horizontal surface of the substrate 12 (hereinafter referred to as the "height" of the substrate 12 or component thereof). In an aspect, the height data 204 may be gathered by positioning, such as by the robot 14, the height sensor 64 at a position corresponding to a region of the substrate 12, whereupon the height of the substrate 12 or component thereof is measured. This process may be repeated for additional regions of the substrate 12. In an aspect, the substrate 12 is partitioned into a two-dimensional grid of regions and the height of the substrate 12 or component thereof within each region is measured. The height of the substrate 12 or component thereof within each region is included in the height data 204. In another aspect, one or more regions of the substrate 12 may be identified as corresponding, respectively, to one or more components of the substrate 12. In this case, the height sensor 64 may be positioned, such as by the robot 14, to a position corresponding to one of the identified regions and the height sensor 64 may measure the height of the component in the identified region. This process may be repeated for each identified region and the measured heights included in the height data 204.

The height data 204 may be used to generate a height map 206 representative of the height(s) of the substrate or components thereof at various positions on the substrate 12. In some aspects, the height map 206 may comprise a two-dimensional grid of regions wherein each region has a corresponding height value indicative of the height of the substrate 12 or component thereof within that region. The height value may be a relative value (e.g., a height value of 5 out of a range of 1 to 10) or may be an absolute value (e.g., 0.25 inches or other unit of measurement). In other aspects, the height map 206 may comprise a two-dimensional representation of the substrate 12 in which one or more regions of the two-dimensional representation are identified as corresponding, respectively, to one or more components or other portions of the substrate 12. That is, a region of the two-dimensional representation corresponding to a component of the substrate 12 is defined by a boundary or contour corresponding to a boundary or contour defining the component. Each of the identified regions is assigned a height value indicative of the height of the respective component or other portion of the substrate 12.

Based, at least, on the two-dimensional image 202, the height data 204 and/or the height map 206, a three-dimensional representation 208 of the substrate 12 and components thereof may be generated. The three-dimensional representation 208 may be generated, for example, by correlating the two-dimensional image 202 with the height map 206 such that each of the components of the substrate 12 represented in the two-dimensional image 202 may be associated with a corresponding height value from the height map 206. For instance, each of regions in a two-dimensional grid of regions of the two-dimensional image 202 may be correlated with a corresponding region in a two-dimensional grid of regions of the height map 206. Such a three-dimensional representation would comprise a plurality of regions wherein each region is associated with a value from the two-dimensional image (e.g., color, intensity, shade, transparency, etc.) and a height value from the height map 206 and/or the height data 204. Thus, the plurality of regions from the two-dimensional image 202 may form X and Y components of the three-dimensional representation 208 and the corresponding height values from the height map 206 may form a Z component of the three-dimensional representation 208.

It will be appreciated that the three-dimensional representation 208 described herein is simplified compared to a fully detailed three-dimensional model (such as a CAD model) of the substrate 12 in that the three-dimensional representation 208 does not reflect contours of the vertical sides, the underhangs, the undersides, or the internals of the components. This simplified aspect of the three-dimensional representation 208 may allow the three-dimensional representation 208 to be more easily generated, stored, and utilized than a fully detailed three-dimensional model.

The two-dimensional image 202, the height data 204, the height map 206 and/or the three-dimensional representation 208 may be used to generate a control program 210. The control program 210 may be utilized by the controller 18, the motion controller 26, and/or other control device of the dispensing system 10 to cause the applicator 16 to apply material to the components or regions of the substrate 12 identified in the control program 210 and in the manner prescribed by the control program 210 (e.g., making vertical adjustments to the height of the applicator 16 to avoid collision with a component or avoiding movement over some regions of the substrate 12 altogether).

In one embodiment, the control program 210 is generated based, initially, on the two-dimensional image 202. Such a control program 210 may be generated by processing the two-dimensional image 202 of the substrate 12 to identify one or more regions of the substrate 12 to which material is to be applied. Various image processing techniques may be employed to identify a region of the substrate 12 to which material is to be applied. As one example, a region may be identified by detecting a variance in color or intensity in the two-dimensional image 202. In a case where the two-dimensional image 202 comprises a raster image having a two-dimensional grid of regions, as described above, an attribute (e.g., color, intensity, shade, transparency, etc.) of a first region may be compared to the corresponding attribute of a second region, such as a region adjacent to the first region, to identify a variance in the two-dimensional image 202 with respect to that attribute. In such a manner, a set of one or more regions may be identified to have a material applied thereto.

A region of the substrate 12 may also be identified by comparing the two-dimensional image 202 to a separate digital representation, wherein a region in the digital representation, known to correspond to a region and/or component of the substrate 12 to which material is to be applied, is correlated with the region of the two-dimensional image 202.

Further, the set of one or more regions of the two-dimensional image 202 may be identified as corresponding to a region or component of the substrate 12 that vertically protrudes from the surface of the substrate 12. Having determined that the set of one or more regions corresponds to a region or component of the substrate 12 that vertically protrudes, the height of the set of one or more regions may be determined, such as by the height sensor 64. The height of the set of one or more regions may be determined as a single height for the entire set or the height of each region in the set may separately be determined. The control program 210 may thus be generated to include instructions such that the robot 14 and the applicator 16 avoid a collision with the identified vertically-protruding region or component. The instructions may indicate that the robot 14 is to adjust the vertical distance between the robot 14 and/or applicator 16 and the substrate 12 to avoid collision with the vertically protruding region or component. Additionally or alternatively, the instructions may indicate that the robot 14 is to move so as not to pass over the vertically protruding region or component.

In another embodiment, the control program 210 is generated based on the height map 206. As described above, the height map 206 may comprise a plurality of regions (e.g., a two-dimensional grid of regions or cells), with each region having a corresponding height value. By virtue of the height value for each region of the height map 206, the height map 206 may be used to identify a first set of regions of the plurality or regions that vertically protrude from the surface of the substrate 12. Accordingly, the control program 210 may be generated so that the movement of the robot 14 and/or applicator 16 avoids collision with a component, for example, that may be disposed in the regions of the identified vertically protruding first set of regions. For example, the control program 210 may include instructions for the robot 14 to adjust the vertical distance between the robot 14 and/or applicator 16 and the substrate 12. Additionally or alternatively, the control program 210 may include instructions for the robot 14 to not move over the identified vertically protruding first set of regions.

Further, the height map 206 may be used to identify a second set of regions of the plurality of regions to which a material is to be applied. For example, the second set of regions may be identified by virtue of a differential in height value compared to surrounding regions, thus indicating that the second set of regions may correspond to a component to which material is to be applied. Accordingly, the control program 210 may include instructions for the applicator 16 to be positioned, such as by the robot 14, over each region of the second set of regions so that the applicator 16 may apply material to that region. It will be appreciated that the second set of regions may coincide with the above-described first set of regions that vertically protrude from the substrate 12, in which case the control program 210 may also include instructions for the robot 14 to adjust the vertical distance between the robot 14 and/or applicator 16 and the substrate 12 to avoid a collision.

The two-dimensional image 202 may also be used in conjunction with the height map 206 to identify the first set of vertically protruding regions and/or the second set of regions to which material is to be applied. For example, regions or components identified, as described above, in the two-dimensional image 202 may be correlated with the first set of vertically protruding regions and/or the second set of regions to which material is to be applied.

User input, such as via the HMI device 19, may also be used with the height map 206 to identify the first set of vertically protruding regions and/or the second set of regions to which material is to be applied. As an example, a user may be presented on the HMI device 19 with an initial identification of the first set of vertically protruding regions and/or the second set of regions to which material is to be applied. The user may select one or more of the regions from the initial identification. The selected one or more regions may then be used to generate the control program 210.

In yet another embodiment, the control program 210 is generated based on the three-dimensional representation 208 of the substrate 12, which, as described above, is generated based on the two-dimensional image 202 and the height map 206. The three-dimensional representation 208 may be analyzed to identify one or more regions of the substrate 12 that vertically protrude from the substrate 12, such as those corresponding with a component of the substrate 12. The three-dimensional representation 208 may also be analyzed to identify one or more regions of the substrate to which material is to be applied. The control program 210 may thus include instructions such that the robot 14 and the applicator 16 avoid collision with a component in the identified region(s) of the substrate 12 that vertically protrude from the substrate 12. The control program 210 may further include instructions for the robot 14 to position the applicator 16 over the identified region(s) to which material is to be applied such that the applicator 16 may apply material to the substrate 12 and/or component in that region(s).

Figure 3:
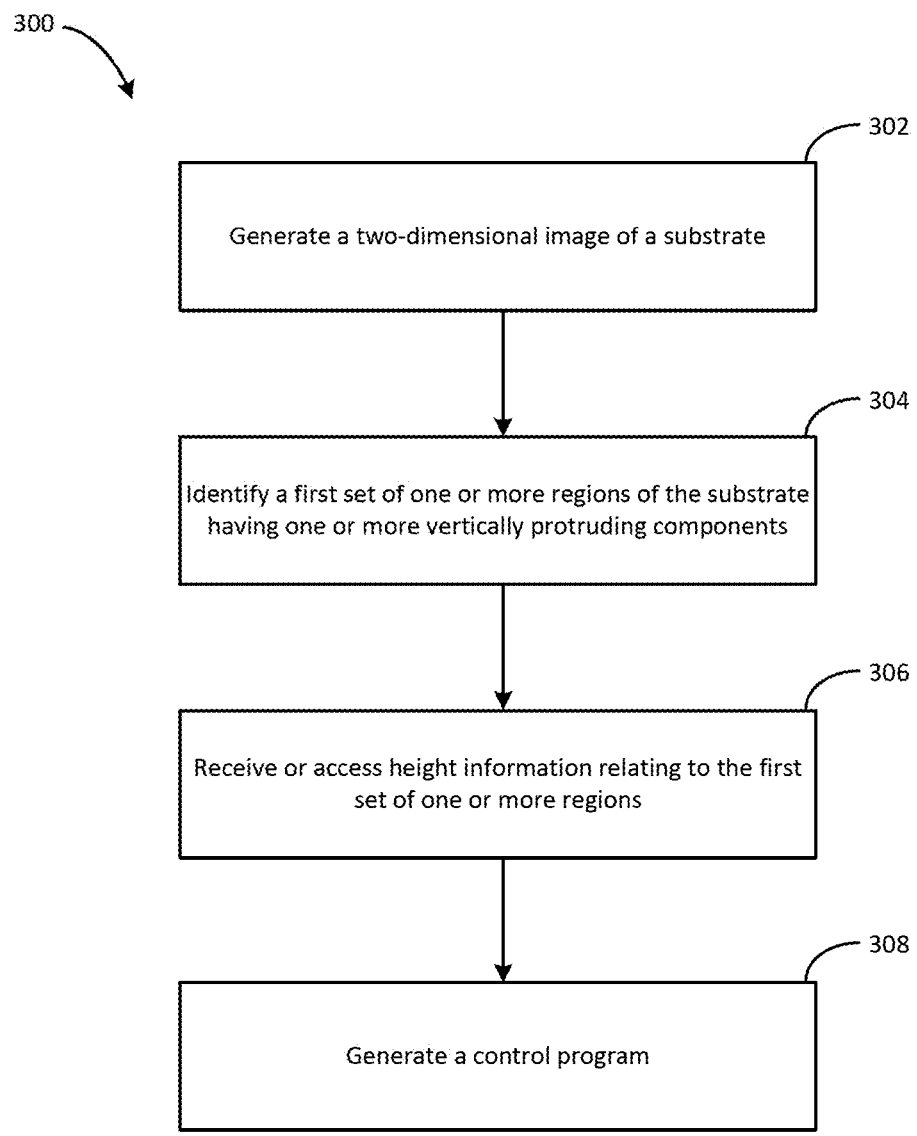
FIG. 3 illustrates a flow diagram of an exemplary method in accordance with an embodiment.

FIG. 3 illustrates an exemplary process 300 of controlling the dispensing system 10, in particular the robot 14, to apply a material to at least a portion of the substrate 12. The process 300 may be executed, at least in part, by the controller 18 and/or the motion controller 26.

At step 302, the two-dimensional image 202 of the substrate 12 is generated, such as via the camera 62. As described above in greater detail, the two-dimensional image 202 may comprise a two-dimensional grid of regions each having an attribute (e.g., color, intensity, shade, transparency, etc.).

Figure 5:
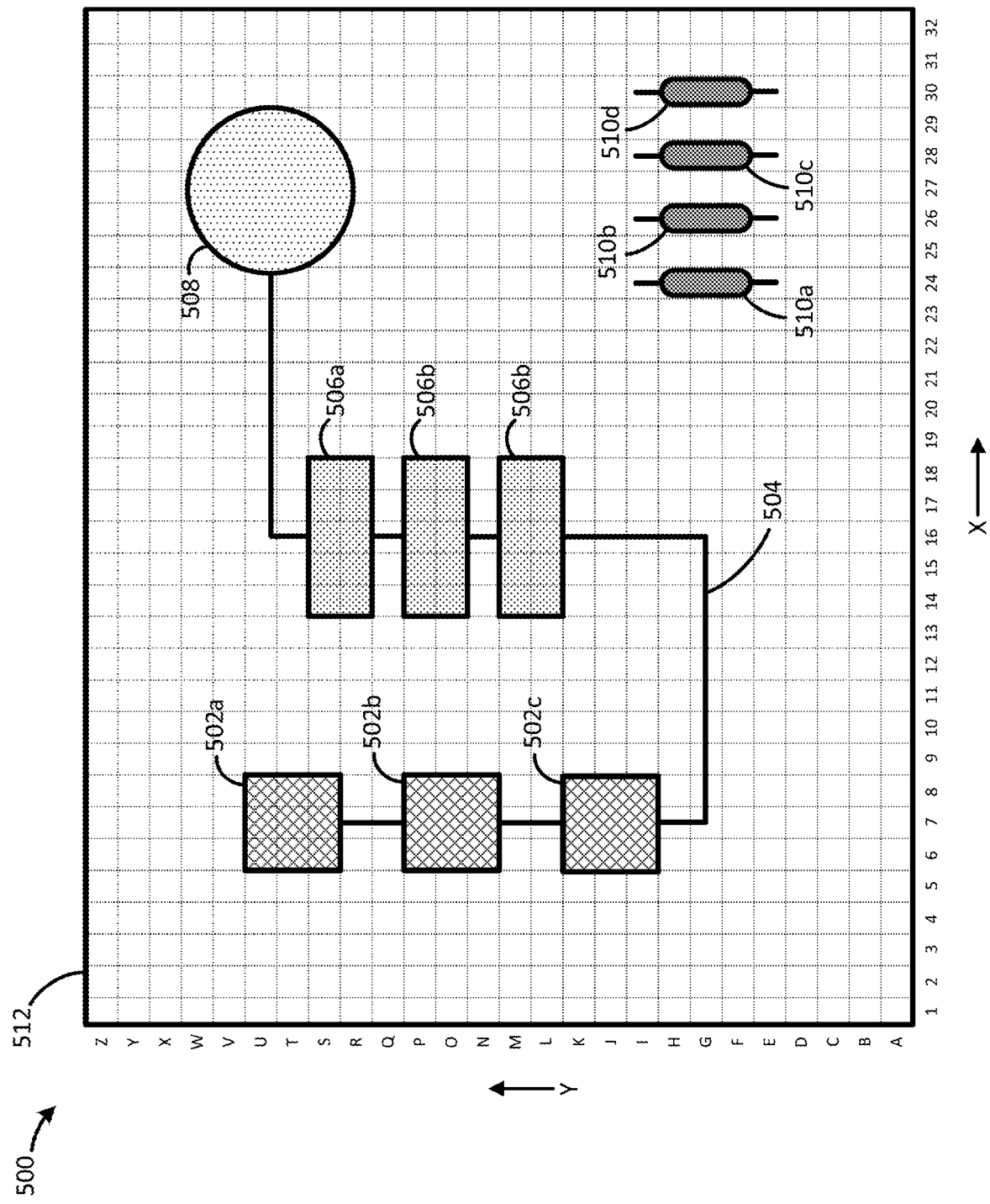
FIG. 5 illustrates an exemplary two-dimensional image of a substrate in accordance with an embodiment.

As a detailed example, FIG. 5 illustrates a two-dimensional image 500 of the substrate 412 depicted in FIG. 4, wherein the images of the substrate 512, connectors 502*a-c*, conductive trace 504, transistors 506*a-c*, a capacitor 508, and resistors 510*a-d* correspond, respectively, with the substrate 412, the connectors 402*a-c*, the conductive trace 404, the transistors 406*a-c*, the capacitor 408, and the resistors 410*a-d* of FIG. 4. The two-dimensional image 500 includes a two-dimensional grid of regions, identified along the X-axis as 1-32 and along the Y-axis as A-Z. Each of the regions has a corresponding color attribute. For example, the region of X-Y coordinates 6, U (of which the image of the connector 502*a* is partially comprised) has a first color attribute and the other regions comprising the connectors 502*a-c* also have the first color attribute. The region of 14, S (of which the image of the transistor 506*a* is partially comprised) has a second color attribute and the other regions comprising the transistors 506*a-c* also have the second color attribute. The region of 27, U (of which the image of the capacitor 508 is partially comprised) has a third color attribute and the other regions comprising the capacitor 508 also have the third color attribute. The region of 24, H (of which the image of the resistor 510*a* is partially comprised) has a fourth color attribute and the other regions comprising the resistors 510*a-d* also have the fourth color attribute. The regions of the image of the substrate 512 not having any component (e.g., the image of the surface of the substrate) have a fifth color attribute. In regions that may be multi-colored (e.g., 11, G or 25, S), the predominant color may be used as the color attribute for that region or the color that differs from a base color (e.g., the color of the surface of the substrate) may be used as the color attribute for that region.

Returning to FIG. 3, at step 304, based at least on the two-dimensional image 202, a first set of one or more regions of the substrate 12 having one or more vertically protruding components are identified. The first set of one or more regions of the substrate 12 may be identified, for example, by detecting a variance in color or intensity in the two-dimensional image 202.

Continuing the detailed example relating to FIG. 5, regions corresponding to the various components depicted in the image of the substrate 512 may be identified by detecting variances in the color attributes of the regions. For example, the region of 6, U may be identified as a region corresponding to the image of the connector 502a by comparing the color attribute of the region of 6, U (the first color) with the color attribute of the regions of 5, U and/or 6, V (the fifth color). Since there is a color variance, the region of 6, U may be identified as a region defining a boundary or contour of the image of the connector 502a (and thus also the connector 402a). The other regions making up the image of connector 502a may also be identified in a similar manner. This process may be repeated for each region of the two-dimensional image 500 to identify other regions corresponding to the other components depicted in the image of the substrate 512.

In some instances, all of the regions identified in the two-dimensional image 500 as corresponding to components are also identified as regions to which material is to be applied. In other instances, only a subset of the regions identified in the two-dimensional image 500 as corresponding to components are identified as regions to which material is to be applied. For example, only certain components (and corresponding regions) or types of components are to have material applied thereto. One way to achieve this (as well as to generally identify a region and/or component to which to apply material or to generally identify a region and/or component that vertically protrudes) may be for the shape of the identified region(s) to be cross-referenced with a known profile of component shapes to identify the type of component comprised by the identified region(s). Another way to achieve this selective application of material to components (as well as to generally identify a region and/or component to which to apply material or to generally identify a region and/or component that vertically protrudes) may be for the color attributes of the identified region(s) comprising a component to be cross-referenced with a known profile of component colors, by which the type of component may be determined.

As discussed above, the first set of one or more regions of the substrate 12 may be identified according to various other techniques, such as correlating the two-dimensional image 202 of the substrate 12 to a different digital representation of the substrate 12 or receiving user input.

Referring back to FIG. 3, at step 306, height information relating to the first set of one or more regions of the substrate 12 having vertically protruding components is received or accessed. For example, a height for each region of the first set of regions having vertically protruding components is determined. The height for each region may be determined by the height sensor 64. To determine the height for each region of the second set of regions, for example, the height sensor 64 may be positioned, such as by the robot 14, above the region and the height sensor 64 may measure the height for that region. In another aspect, the height information may be accessed or received from another source besides the height sensor 64. For instance, height information relating to the substrate 12 and components thereof may already be known and stored in the memory 44 of the controller 18 or other storage source. In this instance, the stored height information may be correlated with the each region of the first set of one or more regions of the substrate 12 having vertically protruding components to determine a height for each of said regions.

Referring again to FIGS. 4 and 5 and continuing the detailed example to which these figures relate, for each component (and region(s) thereof) of the substrate 412 that was identified as vertically protruding from the surface of the substrate 412, the height that the component (and region(s) thereof) vertically extends from the surface of the substrate 412 may be determined. For example, since the connector 402a was determined in step 304 to vertically protrude from the surface of the substrate 412, the height of one or more regions making up the connector 402a may be determined. The height of the one or more regions making up the connector 402a may be determined, for example, by moving the height sensor 64 to a position corresponding to the one or more regions (e.g., 6, U) making up the connector 402a at which the height sensor 64 measures the height. In an aspect, a single region of the connector 402a may be determined and used as a representative height for that component. In another aspect, two or more (or all) regions of the connector 402a may be determined.

Returning to FIG. 3, at step 308, the control program 210 is generated. The control program 210 is generated according to, at least, the identified first set of one or more regions having one or more vertically protruding components from step 304 and the height information accessed or received in step 306. The control program 210 may be used by the controller 18 and/or motion controller 26 to position the applicator 16 relative to the substrate 12 and dispense the material onto the substrate 12. In one aspect, the control program 210 may be used by the controller 18 and/or the motion controller 26 and includes instructions for the dispensing system 10 to dispense material to the identified first set of one or more regions of the substrate 12. In particular, the control program 210 may include instructions for the robot 14 to position the applicator 16 relative to one or more positions corresponding to the identified first set of one or more regions of the substrate 12 and cause the applicator to dispense material on the substrate 12.

Further, the control program 210 may include instructions for the dispensing system 10 to dispense material to the substrate in a manner such that the robot 14, applicator 16, or other part of the dispensing system 10 avoids collision with a protrusion (e.g., a component) in a region of the first set of one or more regions of the substrate 12 having a vertically protruding component. The control program 210 may include instructions for the robot 14 to adjust the vertical distance between the robot 14 and/or applicator 16 and the substrate 12 and/or component thereof. Additionally or alternatively, the control program 210 may include instructions for the robot 14 to move in a manner that avoids moving the applicator 16 over one or more of the first set of one or more regions of the substrate 12 having a vertically protruding component.

Figure 6:
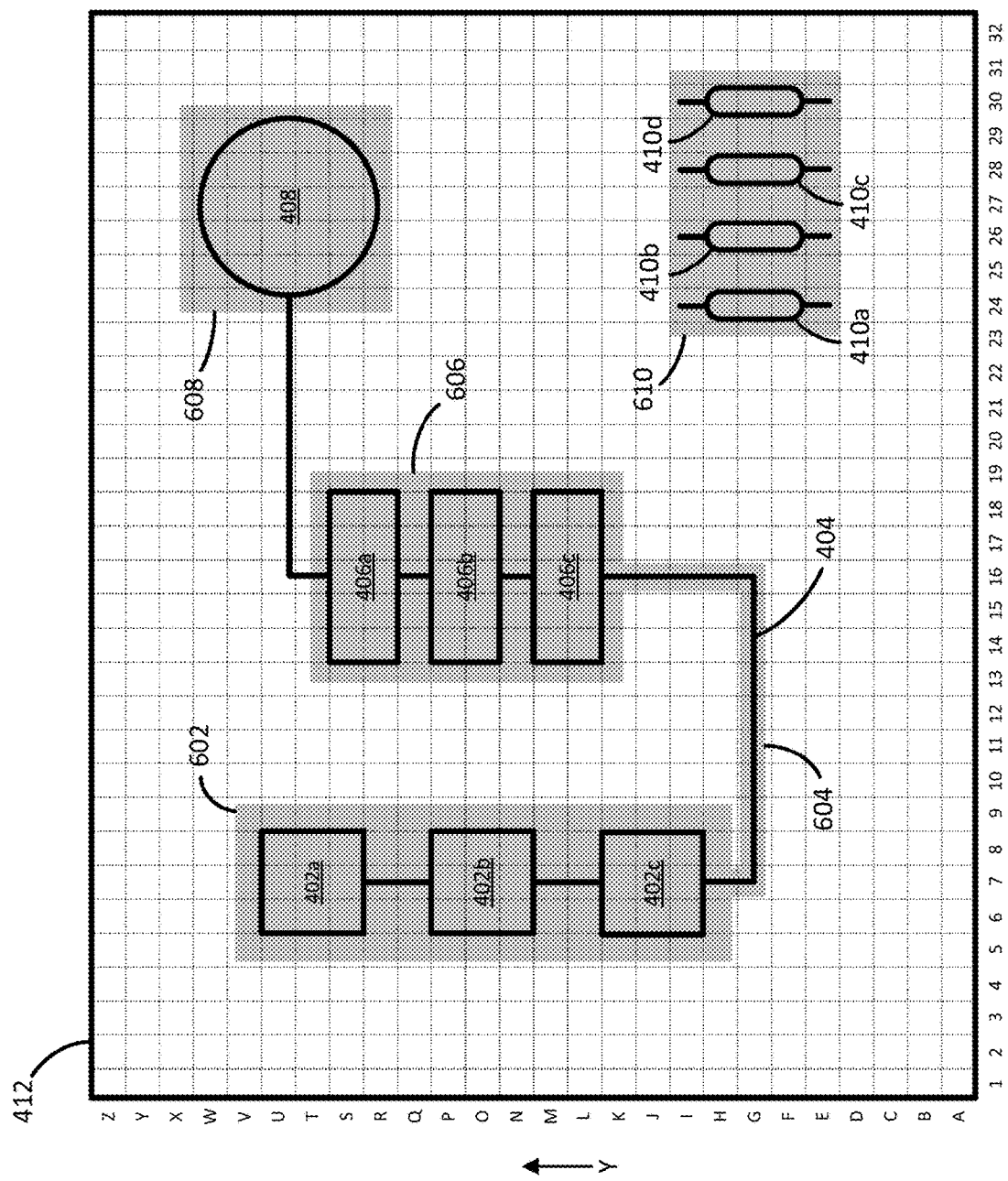
FIG. 6 illustrates an overhead view of an exemplary substrate in accordance with an embodiment.

Continuing the detailed example relating to FIGS. 4 and 5, FIG. 6 depicts the substrate 412 of FIG. 4 with material applied to regions corresponding to the components of the substrate 412. In particular, material 602 is applied to the regions corresponding to the connectors 402a-c, material 604 is applied to the conductive trace 404, material 606 is applied to the transistors 406a-c, material 608 is applied to the capacitor 408, and material 610 is applied to the resistors 410a-d. These dispensed areas of material may be achieved by including instructions in the control program 210 for the applicator 16 to be positioned over each of the aforementioned regions and dispense the material.

Further, to the extent that one or more of the regions corresponding to any of the components were identified in step 304 as vertically protruding from the surface of the substrate 412, the control program 210 may include instructions for the robot 14 to position the applicator 16 in a manner that avoids collision of the applicator 16 or other part of the dispensing system 10 with a vertical protrusion in such region(s). For example, since the connector 402a and regions thereof were identified in step 304 as vertically protruding from the surface of the substrate 412, the control program 210 may include instructions for the robot 14 to position the applicator 16 in a manner that avoids collision with the connector 402*a*. If the height of the connector 402*a* is determined in step 306, the control program 210 may further include instructions for the robot 14 to adjust the vertical distance between the robot 14 and/or applicator 16 and the connector 402*a*.

Figure 7:
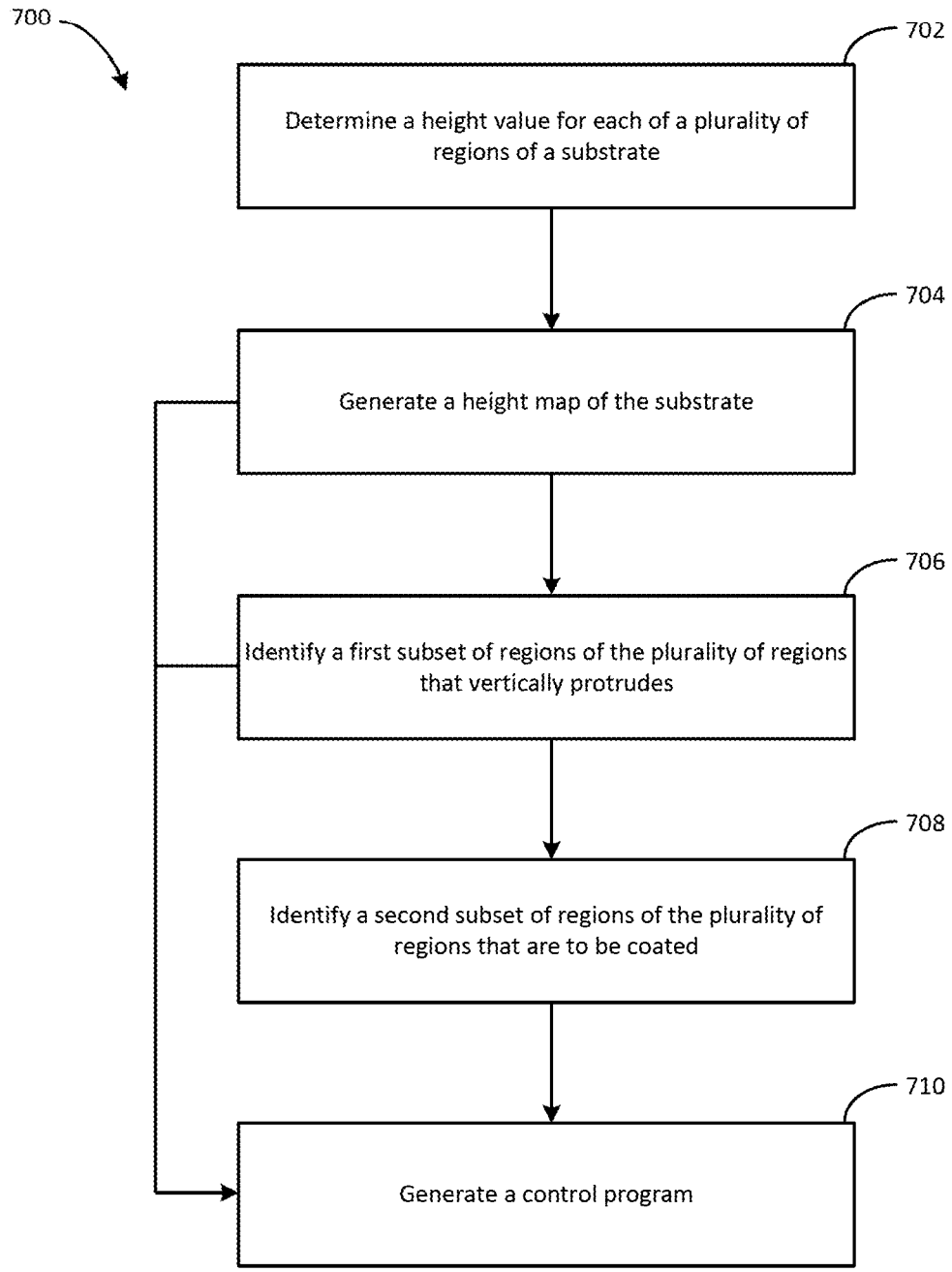
FIG. 7 illustrates a flow diagram of an exemplary method in accordance with an embodiment.

FIG. 7 illustrates an exemplary process 700 of controlling the dispensing system 10, in particular the robot 14, to apply a material to at least a portion of the substrate 12. The process 700 may be executed, at least in part, by the controller 18 and/or the motion controller 26.

At step 702, a height value for each of a plurality of regions of the substrate 12 is determined. The height value may be determined via the height sensor 64. For example, the robot 14 may sequentially position the height sensor 64 relative to each region of the plurality of regions and the height sensor 64 may ascertain a height value (e.g., a distance that the region or component within the region vertically protrudes from the surface of the substrate 12) for each region.

At step 704, based at least on the height values of step 702, the height map 206 is generated. As described above in greater detail, the height map 206 may comprise a plurality of regions, such as a two-dimensional grid of regions, with each region having a height value.

Figure 8:
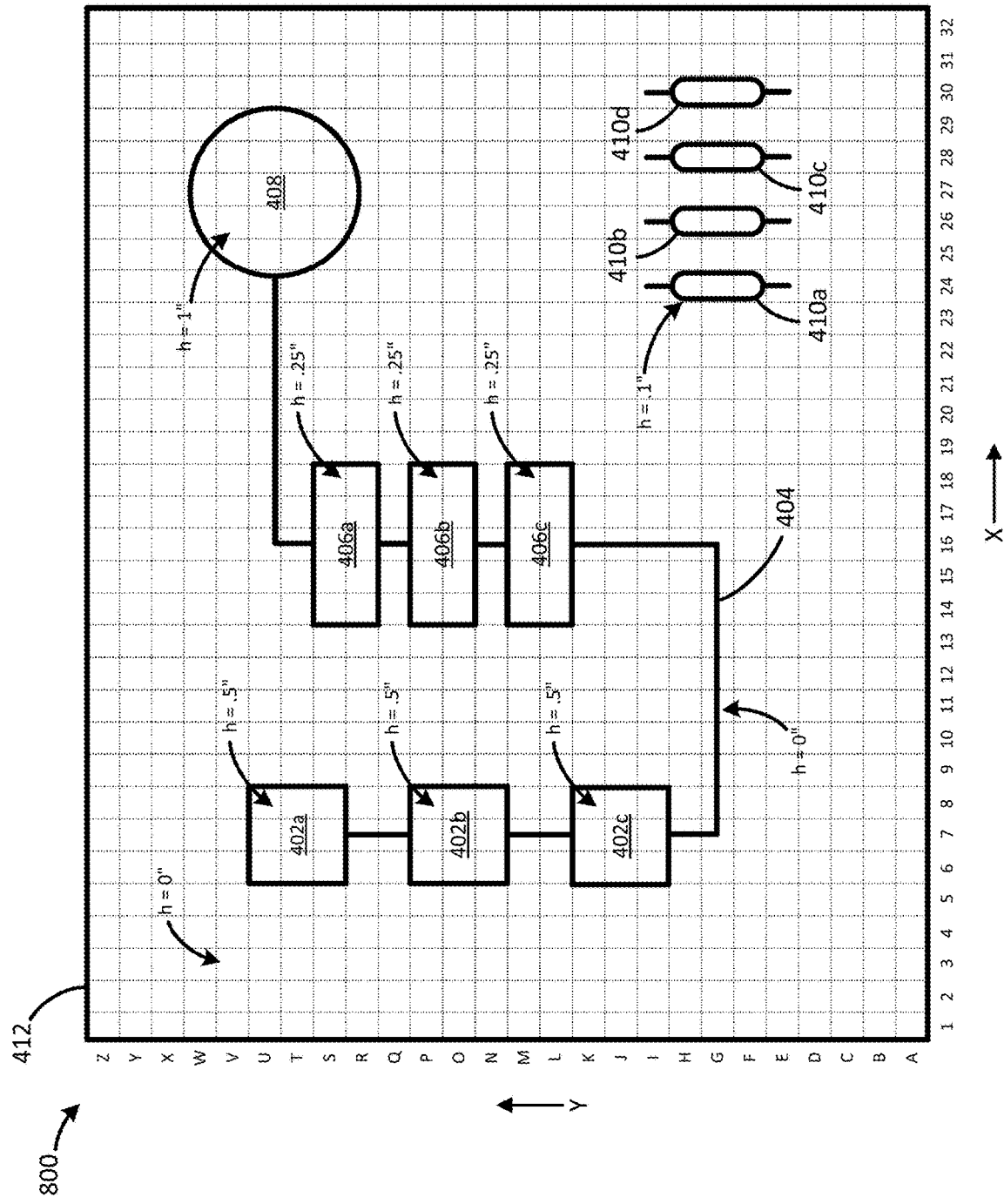
FIG. 8 illustrates an exemplary height map in accordance with an embodiment.

As a detailed example, FIG. 8 illustrates a height map 800 of the substrate 412 shown in FIG. 4. The height map 800 includes a two-dimensional grid of regions, identified along the X-axis as 1-32 and along the Y-axis as A-Z. It will be appreciated that each of the regions of the height map 800 may be readily correlated with the corresponding region of the substrate 412 shown in FIG. 4. Each of the regions in the height map 800 has a corresponding height value, such as the height value determined in step 702. The regions corresponding to the surface of the substrate 412 (i.e., the portions of the substrate 412 without any component) have a height value (h) of 0". The regions corresponding to the connectors 402*a-c* have a height value of 0.5"; the regions corresponding to the conductive trace 404 have a height value of 0"; the regions corresponding to the transistors 406*a-c* have a height value of 0.25"; the regions corresponding to the capacitor 408 have a height value of 1"; and, finally, the regions corresponding to the resistors 410*a-d* have a height value of 0.1".

Returning to FIG. 7, optionally, at step 706 and based at least on the height map 206 generated in step 704, a first subset of regions of the plurality of regions may be identified that vertically protrude from the surface of the substrate 12. For example, the height value of each of the regions of the plurality of regions may be compared against a pre-determined height threshold and those regions with a height value exceeding the pre-determined height threshold are included in the first subset of regions that vertically protrude from the surface of the substrate 12.

Continuing the detailed example relating to FIG. 8, the height map 800 may be used to identify the first subset of regions that vertically protrude from the surface of the substrate 412. For example, if 0" is used as the pre-determined height threshold (i.e., the height value of the surface of the substrate 412), the regions corresponding to the connectors 402*a-c*, the transistors 406*a-c*, the capacitor 408, and the resistors 410*a-d* would be included in the first subset of regions that vertically protrude. Yet, as another example, if 0.1" is used as the pre-determined height threshold, only the regions corresponding to the connectors 402*a-c*, the transistors 406*a-c*, and the capacitor 408 would be included in the first subset of regions that vertically protrude.

Referring again to FIG. 7, optionally, at step 708, a second subset of regions of the plurality of regions may be identified, wherein the second subset of regions comprises regions to which material is to be applied. The second subset of regions to which material is to be applied may be determined by virtue of the height values of step 702, the height map of step 704, and/or the identification of the first subset of regions that vertically protrude of step 706. For example, if a region is identified as vertically protruding from the surface of the substrate 12, it may be presumed that the region corresponds to a component of the substrate 12 and thus material should be applied to that region.

Alternatively or additionally, the second subset of regions to which material is to be applied may be determined based on the two-dimensional image 202 of the substrate 12. For example, as described in greater detail herein, various image analysis techniques may be applied to the two-dimensional image 202 to identify the second subset of regions to which material is to be applied. In particular, variances in an attribute (e.g., color, intensity, shade, transparency, etc.) of the regions in the two-dimensional image 202 may be detected to identify the components (or contours thereof) of the substrate 12, the corresponding regions of which may be included in the second subset of regions to which material is to be applied.

It will be appreciated that the first subset of regions that vertically protrude from the surface of the substrate 12 and the second subset of regions to which material is to be applied may fully coincide, partially coincide, or be mutually exclusive. For instance, the regions corresponding to a component may vertically protrude yet still be intended to have material applied thereto.

Continuing the detailed example relating to FIG. 8, the second subset of regions to which material is to be applied of the plurality of regions of the substrate 412 may be identified according to the height values of the height map 800. For instance, the regions that a height value (h) is greater than a pre-determined height threshold (e.g., 0" or 0.1") may be included in the second subset of regions to which material is to be applied. Alternatively or additionally, the second subset of regions to which material is to be applied may be identified using the two-dimensional image 500 shown in FIG. 5 and which represents the substrate 412. For example, the regions corresponding to the image of the connector 502*a* may be identified by detecting a variance in the color attribute of those regions and the color attribute of the regions of the surrounding surface of the substrate 412.

Returning to FIG. 7, at step 710, the control program 210 is generated for the dispensing system 10, and the robot 14 in particular, to position the applicator 16 relative to the plurality of regions of the substrate 12 and dispense the material on the substrate 12. The control program 210 is generated based, at least, on the height map 206 generated in step 704. Optionally, the control program 210 may further be based on the first subset of regions that vertically protrude from the surface of the substrate 12 identified in step 706. Such a control program 210 may include instructions for the robot 14 to position the application 16 in a manner that avoids collision of the applicator 16 or other part of the dispensing system 10 with the vertically protruding region(s) or component(s) comprised of the vertically protruding region(s). The control program 210 may further include instructions to adjust the vertical distance between the robot 14 and/or applicator 16 and the vertically protruding region(s) or component(s) comprised of the vertically protruding region(s).

Optionally, the control program 210 may be further based on the second subset of regions to which material is to be applied, as identified in step 708. Accordingly, the control program 210 may include instructions for the robot 14 to position the applicator 16 over each region of the second subset of regions to dispense material onto said region.

Concluding the detailed example relating to FIG. 8, attention is directed again to FIG. 6, which depicts the substrate 412 with material applied to the regions corresponding to the components of the substrate 412. As already described above, the material 602 is applied to the regions corresponding to the connectors 402a-c, the material 604 is applied to the conductive trace 404, and so forth. These material applications may be achieved by adjusting the vertical distance between the robot 14 and/or applicator 16 and the region and/or component according to the respective height value from the height map 800. For example, dispensing material onto the regions corresponding to the capacitor 408 may be achieved by adjusting the vertical position of the robot 14 and/or applicator 16 to compensate for the 1" height of the capacitor 408 so that the robot 14 and/or applicator 16 does not collide with the capacitor 408.

Further, to the extent that a second subset of regions of the substrate 412 was identified as intended to have material applied thereto in step 708, the control program 210 may include instructions for the robot 14 to position the applicator 16 over each region of the second subset of regions to dispense material onto said region. For example, if the regions corresponding to the connectors 402a-c were identified as intended to have material applied thereto, the control program 210 may include instructions for the robot 14 to position the applicator 16 over each of those regions and dispense the material 602.

Figure 9:
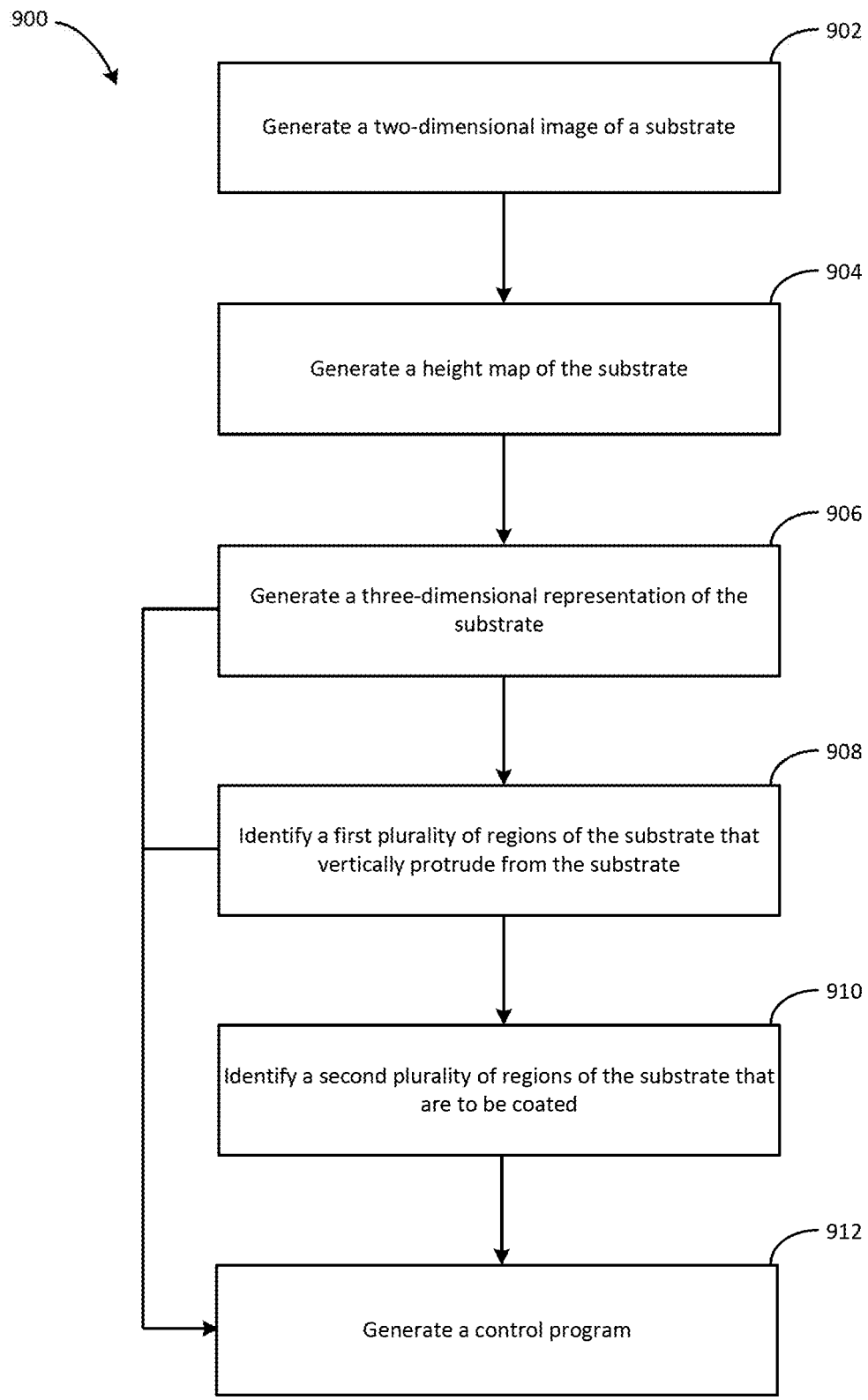
FIG. 9 illustrates a flow diagram of an exemplary method in accordance with an embodiment.

FIG. 9 illustrates an exemplary process 900 of controlling the dispensing system 10, the robot 14 in particular, to dispense material to at least a portion of the substrate 12. The process 900 may be executed, at least in part, by the controller 18 and/or the motion controller 26.

At step 902, the two-dimensional image 202 of the substrate 12 is generated. The two-dimensional image 202 may be generated via the camera 62. The two-dimensional image 202 may include a two-dimensional grid of regions, with each region having an attribute (e.g., color, intensity, shade, transparency, etc.). As an example of the two-dimensional image 202 and as fully described above, FIG. 5 depicts the two-dimensional image 500 of the substrate 412 from FIG. 4.

At step 904, the height map 206 of the substrate 12 is generated. The height map 206 may comprise a plurality of regions, such as a two-dimensional grid of regions, with each region having a height value. The height value of reach region of the height map 206 may be determined via the height sensor 64. As an example of the height map 206 and as fully described above, FIG. 8 depicts the height map 800 representative of the substrate 412.

At step 906 and based on the two-dimensional image 202 from step 902 and the height map 206 from step 904, the three-dimensional representation 208 is generated. The three-dimensional representation 208 may be generated, for example, by correlating the two-dimensional features of the two-dimensional image 202 (providing the aspects of the three-dimensional representation 208 in the X and Y axes) with the respective height values of the height map 206 (providing the aspects of the three-dimensional representation 208 in the Z axis).

Figure 10:
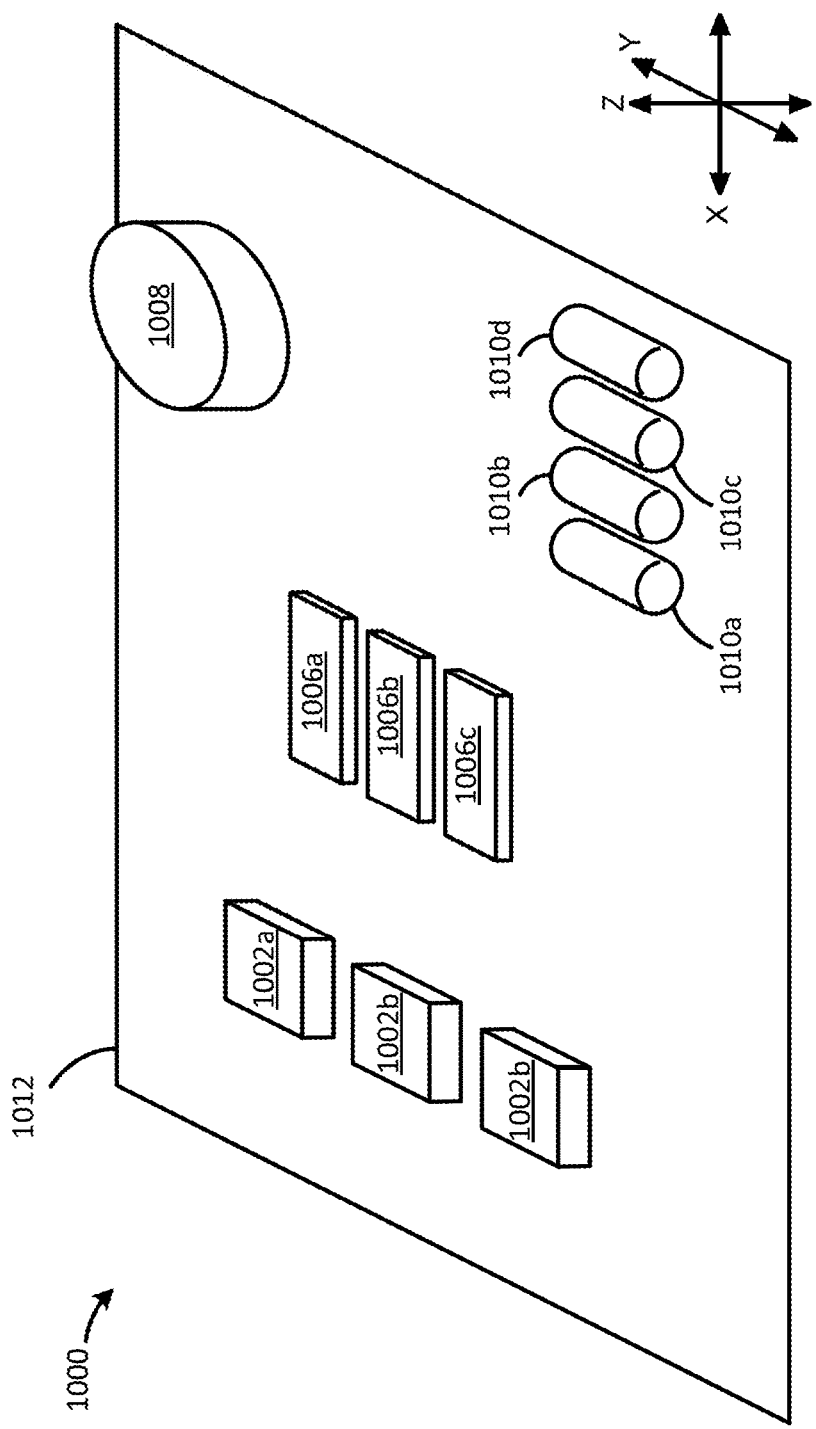
FIG. 10 illustrates an exemplary three-dimensional representation in accordance with an embodiment.

As a detailed example, FIG. 10 illustrates a three-dimensional representation 1000 of the substrate 412 shown in FIG. 4. The three-dimensional image 1000 includes X and Y axes, the aspects of which correspond, respectively, to the aspects along the X and Y axes of the substrate 412. The three-dimensional image 1000 further includes a Z axis, representing a height by which each component and/or region thereof vertically protrudes from the surface of the substrate 412. In the three-dimensional image 1000, the representations of the substrate 1012, connectors 1002a-c, transistors 1006a-c, capacitor 1008, and resistors 1010a-d correspond, respectively, with the substrate 412, the connectors 402a-c, the transistors 406a-c, the capacitor 408, and the resistors 410a-d. Further, the Z axis aspects of the three-dimensional representation 1012 reflect the height values indicated in the height map 800 of the substrate 412 for each of the components disposed thereon.

Optionally, at step 908 and based at least on the three-dimensional representation 208, a first plurality of regions of the substrate 12 that vertically protrude from the surface of the substrate 12 may be identified. For example, the Z axis attribute (e.g., the height value) of a region may be compared against a pre-determined height threshold and if the Z axis attribute exceeds the pre-determined height threshold, the region is included in the first plurality of regions that vertically protrude from the surface of the substrate 12.

Optionally, at step 910 and based at least on the three-dimensional representation 208, a second plurality of regions of the substrate 12 to which material is to be applied is identified. As one example, the second plurality of regions to which material is to be applied may be identified by determining if a region vertically protrudes from the surface of the substrate 12, as described above in relation to step 908, in which case the region may be included in the second plurality of regions to which material is to be applied. If a region is identified to vertically protrude, it may be presumed, in some cases, to correspond to a component of the substrate 12 and thus material is to be dispensed thereon. As another example, the second plurality of regions to which material is to be applied may be identified by analyzing the aspects of the X and Y axes of the three-dimensional representation 208 imparted by the two-dimensional image 202, including the attribute(s) associated with each region. For instance, a variance may be detected in the respective attributes of two or more regions to determine that a region corresponds to a component and thus, in some cases, material is to be applied thereon. As yet another example, the three-dimensional shape formed by one or more regions in the three-dimensional representation 208 may be cross-referenced with a known profile of shapes (e.g., component shapes) to identify the one or more regions as a certain component or type of component. Thus, those one or more regions may be included in the second plurality of regions to which material is to be applied.

It will be appreciated that the first plurality of regions that vertically protrude from the surface of the substrate 12 and the second plurality of regions to which material is to be applied may fully coincide, partially coincide, or be mutually exclusive. For instance, the regions corresponding to a component may vertically protrude yet still be intended to have material applied thereto.

At step 912, based at least on the three-dimensional representation 208 generated in step 906, the control program 210 is generated. The control program 210 may be used by the controller 18 and/or the motion controller 26 and includes instructions for the dispensing system 10, and the robot 14 in particular, to position the applicator 16 relative to the substrate 12 and dispense the material onto the substrate 12.

The control program 210 may further be based on the first plurality of regions that vertically protrude from the surface of the substrate 12 identified in step 908, in which case the control program 210 may include instructions for the robot 14 to position the applicator 16 in a manner that avoids a collision with a protrusion (e.g., a component) in a region of the first plurality of regions that vertically protrude from the surface of the substrate 12. As an example, the control program 210 may include instructions for the robot 14 to adjust the vertical distance between the robot 14 and/or applicator 16 and the substrate 12 and/or component thereof. Additionally or alternatively, the control program 210 may include instructions for the robot 14 to position the applicator 16 in a manner that avoids positioning the applicator 16 or other part of the dispensing system 10 over a vertically protruding region of the first plurality of regions that vertically protrude.

The control program 210 may further be based on the second plurality of regions of the substrate 12 to which material is to be dispensed and identified in step 910. For example, the control program 210 may include instructions for the robot 14 to position the applicator 16 over each region of the second plurality of regions to dispense material onto said region.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

What is claimed is:

1. A method of positioning an applicator of a dispensing system, the applicator configured to dispense a liquid or viscous material onto an electronic substrate, the method comprising:
   generating a two-dimensional image of the electronic substrate using a camera communicatively connected to the dispensing system;
   identifying, based on the two-dimensional image of the electronic substrate, a plurality of sub-regions of the electronic substrate, wherein at least one sub-region of the plurality of sub-regions has a different height, relative to a surface of the electronic substrate, than at least one other sub-region of the plurality of sub-regions;
   determining a first height, relative to the surface of the electronic substrate, associated with the plurality of sub-regions;
   prior to dispensing liquid or viscous material to the plurality of sub-regions of the electronic substrate, using the first height as a representative height, relative to the surface of the electronic substrate, for the plurality of sub-regions to determine a control program for the dispensing system to position the applicator relative to the plurality of sub-regions of the electronic substrate; and
   moving the applicator to dispense the liquid or viscous material onto the plurality of sub-regions of the electronic substrate.

2. The method of claim 1, wherein the control program comprises instructions for at least one of:
   moving at least one of the applicator or the camera to one or more positions corresponding to the identified plurality of sub-regions of the electronic substrate, or
   moving the electronic substrate such that at least one of the applicator or the camera is at a position corresponding to the identified plurality of sub-regions of the electronic substrate.

3. The method of claim 1, wherein identifying the plurality of sub-regions of the electronic substrate comprises at least one of:
   detecting a variance in color in the two-dimensional image,
   detecting a variance in intensity in the two-dimensional image,
   comparing the two-dimensional image to a digital representation of the electronic substrate that is different from the two-dimensional image, or
   receiving a user input identifying the plurality of sub-regions.

4. The method of claim 1, wherein identifying the plurality of sub-regions of the electronic substrate comprises at least one of:
   cross-referencing a shape of a component located in one or more sub-regions of the plurality of sub-regions with a known profile of component shapes, and
   cross-referencing a color of a component located in one or more sub-regions of the plurality of sub-regions with a known profile of component colors.

5. The method of claim 1, wherein the dispensing system further comprises a height sensor, and a height of at least one sub-region of the plurality of sub-regions is determined via the height sensor.

6. The method of claim 1, wherein the control program includes instructions such that the applicator avoids collision with a component located in one or more sub-regions of the plurality of sub-regions.

7. The method of claim 6, wherein the control program includes instructions for the dispensing system to adjust a vertical distance between the applicator and the electronic substrate to avoid collision with a component located in one or more sub-regions of the plurality of sub-regions.

8. The method of claim 6, wherein the control program includes instructions for the applicator to not be positioned over a component located in one or more sub-regions of the plurality of sub-regions.

9. The method of claim 1, further comprising:
   identifying, based on the two-dimensional image of the electronic substrate, a second plurality of sub-regions of the electronic substrate, wherein at least one sub-region of the second plurality of sub-regions has a different height, relative to the surface of the electronic substrate, than at least one other sub-region of the second plurality of sub-regions; and determining a second height, relative to the surface of the electronic substrate, associated with the second plurality of sub-regions, wherein the second height is used as a representative height, relative to the surface of the electronic substrate, for the second plurality of sub-regions to determine the control program.

10. The method of claim 1, wherein identifying the plurality of sub-regions comprises:

determining a first sub-region of the plurality of sub-regions comprising a first component; and determining a second sub-region of the plurality of sub-regions comprising a second component, wherein the first height is based on the greater of a height of the first component and a height of the second component.

11. The method of claim 1, wherein the surface of the electronic substrate comprises a horizontal planar surface and a height of a sub-region of the plurality of sub-regions comprises a vertical height orthogonal to the horizontal planar surface of the electronic substrate.

12. The method of claim 1, wherein the first height is selectively determined based on identifying the plurality of sub-regions.

13. The method of claim 1, wherein at least one sub-region of the plurality of sub-regions comprises at least one component that protrudes above the surface of the electronic substrate.

14. The method of claim 1, wherein a component is located within the plurality of sub-regions, the component comprises two or more portions having different heights from one another, and the first height is indicative of the greater of the respective heights of the two or more portions of the component.

15. A method of positioning an applicator of a dispensing system, the applicator configured to dispense a liquid or viscous material onto an electronic substrate, the method comprising:

determining, using a height sensor, first and second heights, relative to a surface of the electronic substrate, of respective first and second sub-regions of a first plurality of sub-regions of the electronic substrate, the second height being different from the first height;

determining, using the height sensor, third and fourth heights, relative to the surface of the electronic substrate, of respective third and fourth sub-regions of a second plurality of sub-regions of the electronic substrate, the fourth height being different from the third height;

generating, using one of the first or second height as a representative height, relative to the surface of the electronic substrate, for the first plurality of sub-regions and one of the third or fourth height as a representative height, relative to the surface of the electronic substrate, for the second plurality of sub-regions, a height map of the electronic substrate indicating the first plurality of sub-regions as having the one of the first or second height and the second plurality of sub-regions as having the one of the third or fourth height;

prior to dispensing liquid or viscous material to the first and second pluralities of sub-regions of the electronic substrate, determining, based on the height map, a control program for the dispensing system to position the applicator relative to the first and second pluralities of sub-regions of the electronic substrate; and moving the applicator to dispense the liquid or viscous material onto the first and second pluralities of sub-regions of the electronic substrate.

16. The method of claim 15, wherein the control program comprises instructions for at least one of:

moving at least one of the applicator or the height sensor relative to the electronic substrate, or moving the electronic substrate relative to the applicator.

17. The method of claim 15, wherein the height map comprises a two-dimensional grid having a plurality of cells, a cell of the plurality of cells corresponding to a sub-region of the first or second pluralities of sub-regions.

18. The method of claim 15, wherein the control program includes instructions such that the applicator avoids collision with a component located in one or more sub-regions of the first or second pluralities of sub-regions; and wherein the control program causes the applicator to avoid collision with the component by at least one of: adjusting a vertical distance of the applicator relative to the electronic substrate and not positioning the applicator over the component.

19. The method of claim 15, wherein generating the height map comprises comparing at least one of the first and the second heights with a pre-determined height threshold value, and wherein generating the height map comprises comparing at least one of the third and the fourth heights with the pre-determined height threshold.

20. The method of claim 15, wherein the control program includes instructions such that the applicator is positioned over a component located in one or more sub-regions of the first or second pluralities of sub-regions to dispense liquid or viscous material onto said component.

21. The method of claim 15, wherein generating the height map is further based on a two-dimensional image of the electronic substrate.

22. The method of claim 21, wherein generating the height map comprises at least one of:

detecting a variance in color in the two-dimensional image, detecting a variance in color in the two-dimensional image, and receiving user input indicating a component located in one or more sub-regions of the first or second pluralities of sub-regions.

23. The method of claim 15, wherein at least one of the first or second pluralities of sub-regions comprise at least one component that protrudes from the surface of the electronic substrate.

24. The method of claim 15, wherein a component is located within the first plurality of sub-regions, the first component comprises two or more portions having different heights from one another, and the greater of the respective heights of the two or more portions of the component is used as the representative height for the first plurality of sub-regions.

25. The method of claim 24, wherein the one of the first or second height is also used as the representative height for the second plurality of sub-regions.

26. The method of claim 15, wherein the surface of the electronic substrate comprises a horizontal planar surface and a height of a sub-region of the first and second pluralities of sub-regions comprises a vertical height orthogonal to the horizontal planar surface of the electronic substrate.

27. A method of positioning an applicator of a dispensing system, the applicator configured to dispense a liquid or viscous material to an electronic substrate, the method comprising:
- generating a two-dimensional image of the electronic substrate using a camera communicatively connected to the dispensing system;
- identifying, based on the two-dimensional image of the electronic substrate, a plurality of sub-regions of the electronic substrate, wherein at least one sub-region of the plurality of sub-regions has a different height, relative to a surface of the electronic substrate, than at least one other sub-region of the plurality of sub-regions;
- determining a first height, relative to the surface of the electronic substrate, associated with the plurality of sub-regions;
- generating, based on the two-dimensional image and using the first height as a representative height, relative to the surface of the electronic substrate, for the plurality of sub-regions, a three-dimensional representation of the electronic substrate; and
- prior to dispensing liquid or viscous material to the plurality of sub-regions of the electronic substrate, determining, based on the three-dimensional representation, a control program for the dispensing system to position the applicator relative to the plurality of sub-regions of the electronic substrate; and
- moving the applicator to dispense the liquid or viscous material onto the plurality of sub-regions of the electronic substrate.

28. The method of claim 27, wherein the control program comprises instructions for at least one of:
- moving at least one of the applicator or the camera relative to the electronic substrate, or
- moving the electronic substrate relative to at least one of the applicator or the camera.

29. The method of claim 27, wherein the control program includes instructions such that the applicator avoids collisions with a component located in one or more sub-regions of the plurality of sub-regions.

30. The method of claim 29, wherein the control program includes instructions such that the applicator is positioned over a component located in one or more sub-regions of the plurality of sub-regions to dispense liquid or viscous material onto said component.

31. The method of claim 27, wherein the three-dimensional representation comprises X, Y, and Z aspects, the X and Y aspects determined based on the two-dimensional image and the Z aspects determined based on the first height.

32. The method of claim 27, wherein generating the three-dimensional representation comprises identifying a three-dimensional shape in the three-dimensional representation and cross-referencing the three-dimensional shape with a known profile of component shapes.

33. The method of claim 27, wherein the first height is selectively determined based on identifying the associated plurality of sub-regions.

34. The method of claim 27, wherein at least one sub-region of the plurality of sub-regions comprise at least one component that protrudes above the surface of the electronic substrate.

35. The method of claim 27, wherein a component is located within the plurality of sub-regions, the component comprises two or more portions having different heights from one another, and the first height is indicative of the greater of the respective heights of the two or more portions of the component.

36. The method of claim 27, further comprising:
- identifying, based on the two-dimensional image of the electronic substrate, a second plurality of sub-regions of the electronic substrate, wherein at least one sub-region of the second plurality of sub-regions has a different height, relative to the surface of the electronic substrate, than at least one other sub-region of the second plurality of sub-regions; and
- determining a second height, relative to the surface of the electronic substrate, associated with the second plurality of sub-regions,
- wherein the second height is used as a representative height, relative to the surface of the electronic substrate, for the second plurality of sub-regions to generate the three-dimensional representation of the electronic substrate.

37. The method of claim 27, wherein identifying the plurality of sub-regions comprises:
- determining a first sub-region of the plurality of sub-regions comprising a first component; and
- determining a second sub-region of the plurality of sub-regions comprising a second component,
- wherein the first height is based on the greater of a height of the first component and a height of the second component.

38. The method of claim 27, wherein the surface of the electronic substrate comprises a horizontal planar surface and a height of a sub-region of the first and second pluralities of sub-regions comprises a vertical height orthogonal to the horizontal planar surface of the electronic substrate.

* * * * *